United States Patent [19]

Michaelson, Henry W.

[11] Patent Number: 4,605,483

[45] Date of Patent: Aug. 12, 1986

[54] AN ELECTRODE FOR ELECTRO-PLATING NON-CONTINUOUSLY CONDUCTIVE SURFACES

[76] Inventor: Michaelson, Henry W., 744 Birchwood Ct., Westbury, N.Y. 11590

[21] Appl. No.: 668,701

[22] Filed: Nov. 6, 1984

[51] Int. Cl.$^4$ .................. C25B 11/02; C25B 11/04; C25D 17/06; C25D 17/12

[52] U.S. Cl. .................. 204/280; 204/277; 204/297 R; 204/224 R

[58] Field of Search .............. 204/224 R, 297 R, 277, 204/225, 15, 280

[56] References Cited

U.S. PATENT DOCUMENTS

| | | | |
|---|---|---|---|
| 3,536,603 | 10/1970 | Bonga | 204/297 R X |
| 3,835,017 | 9/1974 | Mentone et al. | 204/224 R |
| 4,202,739 | 5/1980 | Csakvary et al. | 204/224 M X |
| 4,454,009 | 6/1984 | Cockeram et al. | 204/224 R X |

FOREIGN PATENT DOCUMENTS 1098182  1/1968  United Kingdom .................. 204/15

*Primary Examiner*—Donald R. Valentine
*Attorney, Agent, or Firm*—Peter L. Michaelson

[57] ABSTRACT

Apparatus for use as an electrode, which is particularly suited for use in electro-plating non-continuous conductive objects, particularly double-sided circuit boards, is described. Specifically, this electrode comprises: a housing having a plurality of sides and an internal enclosed air chamber, wherein at least one of the sides is flexible and conductive and the remaining sides are rigid and non-conductive; a port extending through one of the sides and into the chamber for routing a compressed fluid into the chamber; and means for holding a printed circuit board against the electrode such that whenever sufficient fluid is routed into the chamber the flexible side forceably distends into abutting electrical contact with a surface of the printed circuit board. Since the conductive side is electrically continuous over substantially all its surface area, whenever this side is distended and abuts against and establishes electrical contact with one side of a double-sided printed circuit board, plating current advantageously reaches substantially all the traces on that side of the board regardless of where these traces are actually situated. Thus, the same electrode can be used for plating a wide multitude of different printed circuit boards, thereby advantageously saving considerable time and expense.

15 Claims, 3 Drawing Figures

AN ELECTRODE FOR ELECTRO-PLATING NON-CONTINUOUSLY CONDUCTIVE SURFACES

BACKGROUND OF THE INVENTION

1. Field of the Invention

The present invention relates to an electrode particularly suited for use in electrolytically plating non-continuously conductive surfaces.

2. Description of the Prior Art

Electrolytic plating is often used to deposit a layer of conductive material, often copper, onto one or more conductive surfaces of a part. Since electrolytic plating relies on passing an electrical current through an appropriate plating solution, two separate electrical connections of opposite polarity must be made to the solution. As soon as current flow is initiated between these connections, (positively charged) metallic, e.g. cupric, ions flow away from the positive connection and towards the negative connection. Since the latter connection provides a source of free electrons, each cupric ion completes its valence shell at the negative connection. When this occurs the cupric ion ceases to remain ionized and thus precipitates out of solution. As a result, a layer of copper is deposited on substantially all the submerged surface area of the negative connection. Consequently, the part to be plated is typically attached to the negative connection and submerged in the plating solution. In effect the part becomes an extension of the negative connection and as a result is coated with copper during the plating process. Generally, an electrical connection is made to the part by means of a suitable electrode.

As long as the part to be plated has continuous conductive surfaces, such as for example a flat conductive sheet or sphere, the electrode can be rather simple and, in fact, is often nothing more than a suitable wire having a single terminal that is mechanically and electrically connected to the surface(s) to be plated. However, oftentimes the conductive surface is non-continuous, i.e. the surface possesses isolated conductive regions surrounded by insulating regions. For this latter situation, a single terminal will not suffice because, no matter where the terminal is affixed to the surface, some of the conductive regions will not receive any current flow and hence will not be plated.

This problem is particularly acute whenever a surface of a double-sided printed circuit board, having a number of narrow conductive traces on each side, is to be plated. In this situation, one well known solution involves the use of a so-called point-contact type electrode. Specifically, this electrode has a plurality of pins, each of which abuttingly presses against and thus establishes electrical contact with a separate conductive region existing on one side of the board in order to provide a sufficient amount of current to plate the second side. Furthermore, each of these conductive regions includes a plated-through hole which forms an electrical connection between two oppositely situated conductive regions which in effect sandwich the hole. As a result, plating current is routed from all the pins abutting against one side of the board, and through the conductive regions existing on that side as well as through the plated-through holes, to the conductive regions situated on the second side. After the second side has been plated to a sufficient thickness, the position of the board is reversed so that the second side of the board abuts against the pins thereby routing plating current to the first side and allowing a layer of copper to be deposited onto the conductive regions situated there.

Unfortunately, point-contact electrodes have several major drawbacks. First, point-contact assemblies are very bulky and cumbersome to use. Moreover, to ensure that a solid electrical contact is made between each pin and a side of the board, a spring is attached to each pin which forces it against a side of the board. However, to guarantee that all the springs will function properly, all the pins must be spaced apart by a certain minimum distance. This, in turn, disadvantageously limits the density of the pins and, hence, the resolution (minimum width) and, to a lesser extent, the orientation of the conductive traces that are to appear on the printed circuit board. In addition, point-contact electrodes are usually custom made, i.e. with the pins appropriately situated, to suit the particular layout of traces on the board to be plated. As a result, considerable time and expense are often disadvantageously consumed in fabricating an appropriate point-contact electrode.

SUMMARY OF THE INVENTION

Accordingly, an object of the present invention is to provide an electrode, particularly for use in electrolytically plating non-continuously conductive surfaces, which is compact, simple, and easy to use.

Another object is to provide such an electrode which, when used in electrolytically plating printed circuit boards, does not impose any limit on the resolution and orientation of the traces that are to appear on any side of the board.

A further object is to provide such an electrode which is quick and extremely inexpensive to manufacture.

These and other objects are accomplished in accordance with the present invention by an electrode comprising: a housing having a plurality of sides and an internal enclosed air chamber, wherein at least one of the sides is flexible and conductive and the remaining sides are rigid and non-conductive; a port extending through one of the sides and into the chamber for routing a compressed fluid into the chamber; and means for holding an object to be electro-plated against the electrode such that whenever sufficient fluid is routed into the chamber the flexible side forceably distends into abutting electrical contact with at least one conductive region situated on a surface of the object.

In accordance with the preferred embodiment disclosed herein, the electrode generally resembles a rectangular cylinder having six sides. One of these sides (the "flexible" side) is comprised of a flexible material, having a conductive surface. The remaining five sides are rigid and non-conductive. The flexible material is secured, with its conductive surface facing outward, to a lip formed along the edges of the four sides situated adjacent to the flexible side. Together, all six sides form a hollow and substantially air-tight chamber. A suitable nipple, which mates with an appropriately sized hose, extends through one of the rigid sides and into the chamber. A flange having a u-shaped channel is located along three adjacent edges of the outwardly facing conductive surface. This flange is sufficiently sized to securely hold the object to be plated, such as a printed circuit board against the electrode.

Prior to electro-plating, the board is first inserted into the flange such that three of the edges of the board are held by the u-shaped channel. Thereafter, a pressurized fluid, generally compressed air, is pumped into the chamber. This fluid causes the flexible material to distend and come into abutting conductive electrical contact with one or more conductive traces that appear on one side of the board. The electrode assembly is then immersed in a suitable electroplating solution and electric current is supplied to the conductive surface of the flexible material through a suitable electrical connection made to the material itself. Consequently, this current travels through the conductive surface to the traces appearing on one side of the board, and from there through various plated-through holes to the conductive traces appearing on the other side. Since this latter side is completely exposed to the plating solution, a layer of metal, generally copper, is electrolytically deposited on the traces appearing on this side. Once this side has been completely plated, the electrode is withdrawn from the plating solution. The board is removed from the flange and then reversed and re-inserted into the flange in order to expose the other side of the board to the plating solution. Thereafter, the electrode is again immersed into the plating solution and an appropriate electric current is supplied to electro-plate the remaining side of the board.

Since the conductive surface is continuous and, when pneumatically distended, abuts against and establishes electrical contact with substantially all the surface area on one side of the board, plating current advantageously reaches substantially all the traces on that side of the board regardless of where these traces are actually situated.

BRIEF DESCRIPTION OF THE DRAWING

The invention may be clearly understood by considering the following detailed description taken in conjunction with the accompanying drawing, in which.

To facilitate understanding, identical reference numerals are used to denote identical elements common to the figures.

DETAILED DESCRIPTION

Although the teachings of the present invention are applicable to an electrode suitable for electro-plating any non-continuously conductive surface, the inventive electrode finds particular utility in electro-plating double-sided printed circuit boards by any one of a variety of processes—including but not limited to that fully described in my co-pending U.S. patent application entitled "Additive Adhesive Based Process for the Manufacture of Printed Circuit Boards" Ser. No. 598,924 filed Apr. 10, 1984—and thus will be hereinafter described in that context.

Figure 1:
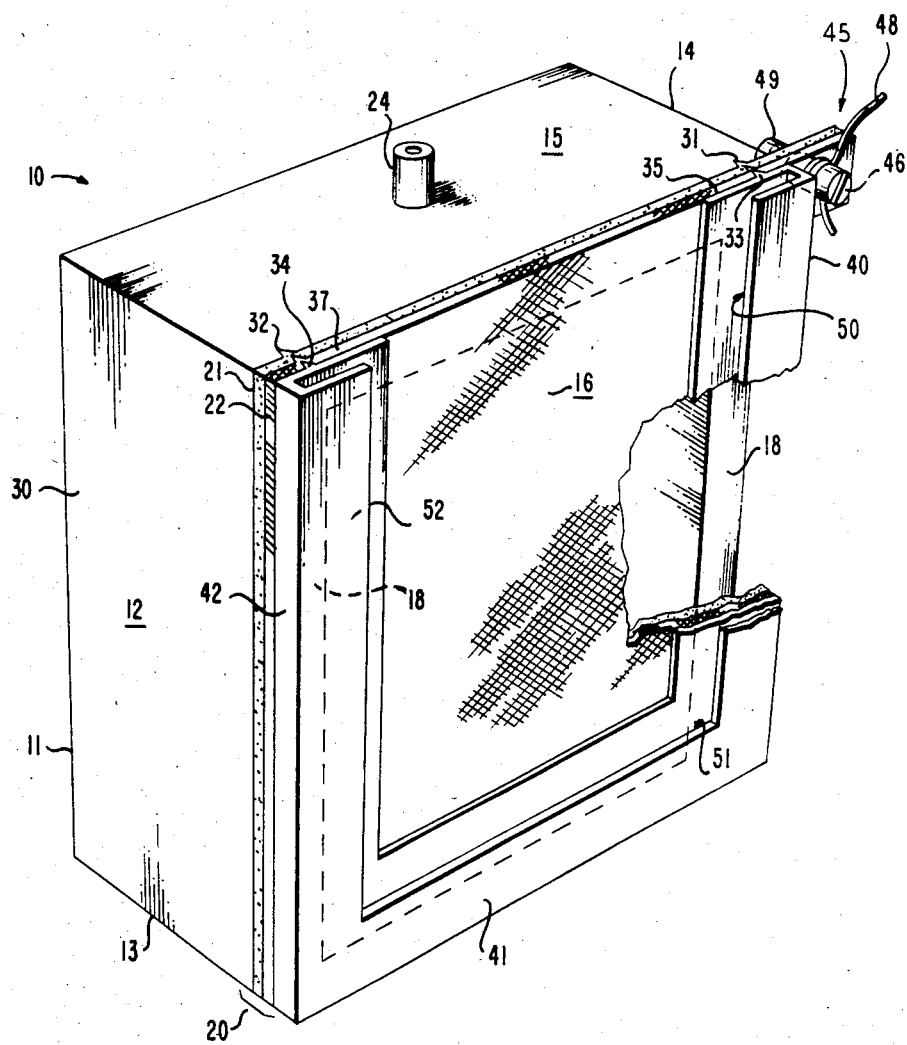
FIG. 1 is a front perspective view of a first embodiment of the electrode constructed in accordance with the teachings of the present invention.

A first embodiment of the electrode incorporating the teachings of the present invention is shown in FIG. 1. As shown, electrode 10 is generally in the form of a rectangularly shaped cylinder having a housing comprised of six sides 11, 12, 13, 14, 15 and 16. Together these sides form an enclosed substantially air-tight air chamber 30 to which the only access is provided through nipple 24 situated on side 15. This nipple is suitably sized to enable it to tightly mate with a fluid, e.g. compressed air, hose of appropriate diameter. Five of the sides, i.e. sides 11, 12, 13, 14 and 15, are rigid and fabricated out of any hard non-conductive material, such as an appropriate plastic or the like. By contrast, side 16 is flexible and conductive. Specifically, side 16 is comprised of flexible member 20 having conductive layer 22 situated on the outwardly facing side of flexible insulating membrane 21. This conductive layer has a low resistivity and is quite thin, although the actual values of resistivity and thickness are both not critical. Copper shim stock having a resistivity of approximately 0.002 ohms/cubic centimeter and a thickness on the order of 0.004–0.006 inches (approximately 0.010–0.015 centimeters) has yielded excellent results when employed as the conductive layer. Alternatively, metallic (e.g. aluminum or copper) foil or a suitable conductive ink can used instead of the shim stock. Flexible insulating membrane 21 is preferably fabricated out of a sheet of rubber or any similar elastic material. Although the actual thickness of this membrane is also not critical, it should be sufficiently thick to withstand the maximum amount of pressure, that will be applied to chamber 30, without bursting and, at the same time, be sufficiently thin to provide, as will be discussed in detail shortly, sufficient distension whenever the chamber is pressurized. Excellent results have been achieved by using sheet rubber having a thickness of approximately 0.006–0.010 inches (approximately 0.015–0.025 centimeters) for flexible membrane 21 and pressurizing the chamber to approximately 25 psi (pounds/square inch). As discussed in greater detail below, flexible member 20 is secured to rigid sides 12, 13, 14 and 15 by a layer of well-known adhesive, e.g. any suitable epoxy, (not shown) applied to lip 18. Since this lip extends completely along the outwardly facing edge of these four sides, it provides a secure mounting platform for flexible member 20. Sufficient adhesive must be used to insure that chamber 30 is air-tight, i.e. that no holes form in the adhesive layer situated between the flexible member and the lip which would otherwise allow air to leak from the chamber.

A printed circuit board is secured to the electrode by work holding flange 44. As shown in FIG. 1, this flange is comprised of three guides, namely guides 40, 41 and 42, situated along the right, bottom and left edges, respectively, of the front surface of conductive layer 22. Each guide consists of a rigid u-shaped non-conductive member that defines a respective channel: channel 50 for guide 40, channel 51 for guide 41 and channel 52 for guide 42. Each guide is fabricated such that the width of its channel slightly exceeds the thickness of the printed circuit board. Hence, whenever a printed circuit board is slid into place between the channels, the side and bottom edges of the board are securely held by these guides. All the guides are secured to conductive layer 22 by a layer of well-known adhesive, e.g. a suitable epoxy, (not shown) applied all along the boundary between each guide and the conductive layer, such as along boundary 35 situated between guide 40 and layer 22, and along boundary 37 situated between guide 42 and layer 22. To reduce any movement of the guide along the surface of conductive layer 22, a v-shaped notch (e.g. notches 31 and 32) is formed along three sides of the lip (only two of which are shown for clarity) and a v-shaped mating extension (e.g. extensions 33 and 34 in guides 40 and 42, respectively) is formed in each of the guides. An adhesive layer exists on both sides of flexible member 20, i.e. completely along the lip, including the three notches, and as noted along the rear surface of each guide including each extension. Flexible member 20 is positioned on the lip and each guide is appropriately placed over this member such that both a portion of flexible member 20 and a respective extension are forced into each notch. Consequently, any relative movement of the guides is inhibited through the engagement of both the notches and the extensions which together sandwich the flexible member.

Electrical plating current is applied to the electrode through connection 45. As shown in detail in FIGS. 1 and 2, this connection merely comprises screw 46 which is attached to a corner of flexible member 20 by nut 49. This screw passes through two washers 47 which together sandwich the flexible member. Nut 49 holds the screw tightly in place and wire 48 is located between the head of the screw and the closest washer.

Figure 2:
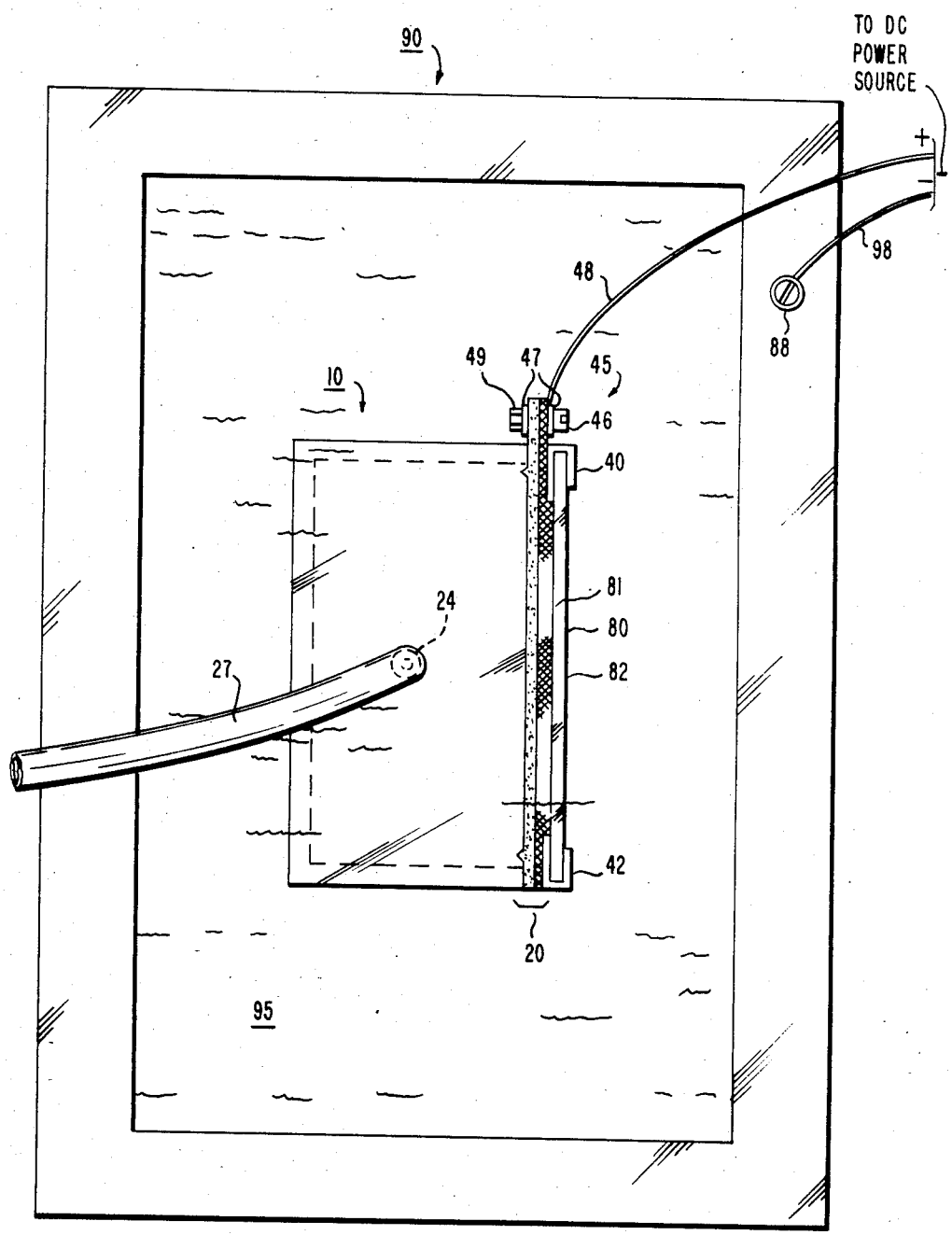
FIG. 2 is a simplified top view of the electrode 10 shown in FIG. 1 and depicted as it is typically used to electro-plate printed circuit board 80.

In use, as shown in FIG. 2, printed circuit board 80 is secured to electrode 10 by the work holding flange. Specifically, the board is slid between guides 40 and 42, and is held in place on the electrode by all three guides (only two of which are shown in this figure). Thereafter, compressed air, generally at a pressure of approximately 20-25 psi, is pumped into the electrode through air hose 27. This air fills the chamber contained within the electrode and, in turn, causes flexible member 20 to outwardly distend. Sufficient air is pumped into the chamber to distend the flexible member enough to permit the conductive layer to abut against and electrically contact substantially all the surface area of rear side 81 of printed circuit board 80. Thereafter, the entire electrode is immersed within electro-plating solution 95 contained within plating tank 90. A suitable source of dc (direct current) power is then applied across leads 48 and 98, the latter of which is attached to the tank by screw terminal 88. This current travels from lead 48 and connection 45 through the conductive layer of flexible member 20 to the traces appearing on side 81 of board 80, and from there through various plated-through holes, which form part of the board, to the conductive traces appearing on the other side of the board, i.e. side 82. Since this latter side and the plated-through holes are both exposed to the plating solution, a layer of copper is electrolytically deposited on the traces appearing on side 82 and on the walls of the plated-through holes. Once these holes and traces have both been plated to a sufficient thickness, the electrode is withdrawn from the plating solution and the air pressure is released. The board is removed from the flange and then reversed and re-inserted into the flange in order to expose side 81 to the plating solution. Thereafter, the electrode is again pressurized and then reimmersed into the plating solution. The electric current is then re-applied this time to electro-plate the remaining side of the board.

Figure 3:
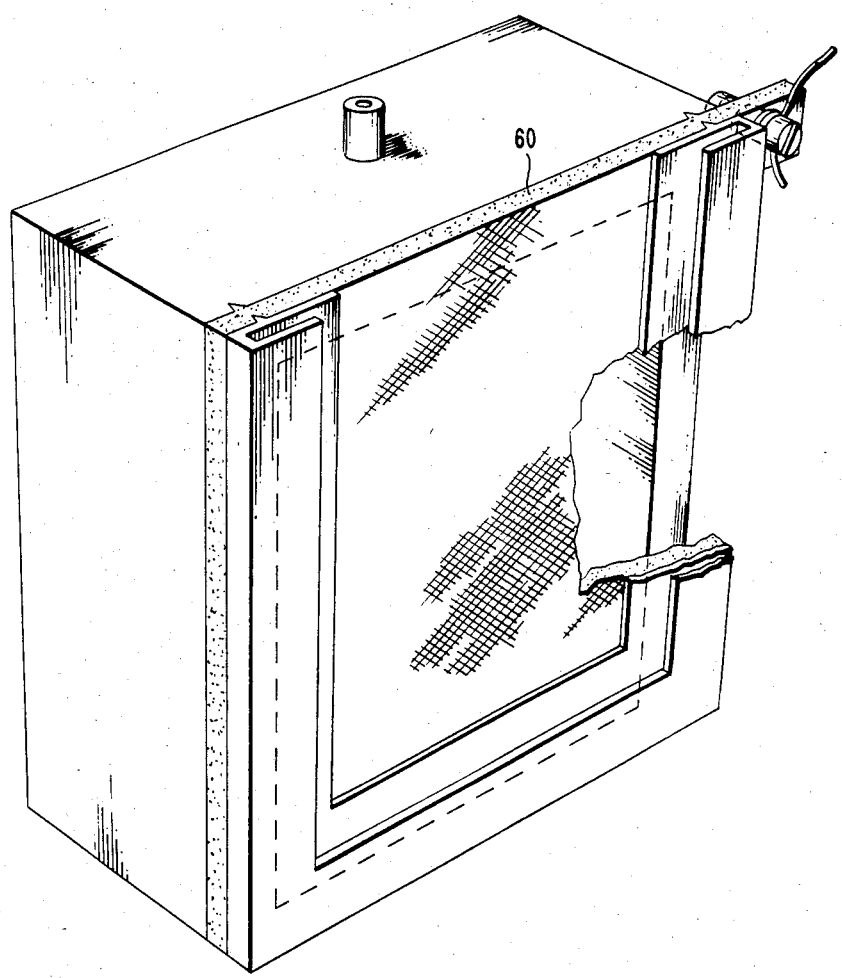
FIG. 3 is a front perspective view of a second embodiment of the electrode constructed in accordance with the teachings of the present invention.

A second embodiment of the inventive electrode is shown in FIG. 3. Here, the flexible member, instead of being constructed as a situated structure as shown in FIGS. 1 and 2, is comprised of a single flexible conductive membrane 60. Excellent results have resulted from using a rubber membrane which is illustratively 0.006-0.010 inches (0.015-0.025 centimeters) thick and has been sufficiently impregnated with conductive particles, illustratively carbon, to possess a resistivity of on the order of illustratively 2-20 ohms/cubic centimeter. The values of thickness and resistivity are both not critical and a wide range of suitable values exist for each which will provide excellent results. In addition, flexible conductive materials other than carbon impregnated rubber will also function well.

Clearly, it will be readily apparent to those skilled in the art that the housing need not have only a rectangular cross-section, but can take on any closed cross-section, e.g. circular, that is easy and inexpensive to manufacture. Moreover, the housing need not be air-tight if a balloon or similar structure is used as the air chamber and is securely attached to that end of the nipple situated within the housing. In this case, the balloon serves as the flexible insulating member. Consequently, a sheet of conductive foil or shim stock alone can be used as the flexible member.

In addition, the inventive electrode can possess more than one flexible member and can thereby have more than one conductive surface. For example, one flexible member can exist on side 11, as shown in FIG. 1, and another flexible member can exist on opposite side 16. Consequently, two printed circuit boards can be secured to the electrode and then both can be electrolytically plated simultaneously. Thus, an electrode constructed in accordance with the principles of the present invention can simultaneously accommodate a multitude of printed circuit boards with the number of boards dependent on the geometry of the electrode.

Lastly, since the work holding flange merely functions to hold the board against the flexible side of the electrode whenever the latter is pressurized, this flange can be mounted in a variety of ways other than on the outwardly facing surface of the flexible member, as shown in FIG. 1. For example, if two boards are to be simultaneously plated, then each board can be mounted in its own flange and both flanges can be secured together and positioned to hold the boards substantially parallel to each other and spaced apart by a set distance. Thereafter, the electrode can be inserted between the boards and then pressurized to provide abutting electrical contact with a surface of both boards simultaneously.

Although two embodiments have been described herein, they merely illustrate the principles of the present invention. Many other varied embodiments employing these principles may be devised by those skilled in the art without departing from the spirit and scope of the invention.

I claim:

1. An electrode, for use in electro-plating an object, comprising:
    a housing having a plurality of sides and an internal enclosed chamber, wherein at least one of the sides is flexible and conductive and the remaining sides are rigid and non-conductive;
    a port extending through one of the sides and into the chamber for routing a pressurized fluid into the chamber; and
    means for holding an object to be electro-plated against the electrode such that whenever sufficient fluid is routed into the chamber the flexible side distends into abutting electrical contact with at least one conductive region situated on a surface of the object.

2. The electrode of claim 1 wherein the flexible conductive side is comprised of a flexible conductive membrane.

3. The electrode of claim 2 wherein the holding means is mounted to an outwardly facing surface of the flexible conductive side.

4. The electrode of claim 3 wherein the holding means is comprised of at least one u-shaped guide.

5. The invention of claim 4 wherein the electrode is further comprised of means for routing electrical current to the flexible conductive side.

6. The electrode of claim 1 wherein the flexible conductive side is comprised of a substantially conductive layer affixed to a flexible insulating membrane.

7. The electrode of claim 6 wherein the conductive layer is either shim stock or foil.

8. The electrode of claim 7 wherein the holding means is mounted to an outwardly facing surface of the flexible conductive side.

9. The electrode of claim 8 wherein the holding means is comprised of at least one u-shaped guide.

10. The electrode of claim 9 wherein the electrode is further comprised of means for routing electrical current to the flexible conductive side.

11. The electrode of claim 1 wherein the flexible conductive side is comprised of a flexible insulating membrane having a conductive surface.

12. The electrode of claim 11 wherein the conductive surface is formed by applying a conductive ink to a surface of said flexible insulating membrane.

13. The electrode of claim 12 wherein the holding means is mounted to an outwardly facing surface of the flexible conductive side.

14. The electrode of claim 13 wherein the holding means is comprised of at least one u-shaped guide.

15. The electrode of claim 14 wherein the electrode is further comprised of means for routing electrical current to the flexible conductive side.

* * * * *